(12) United States Patent
Yamamoto et al.

(10) Patent No.: US 6,211,535 B1
(45) Date of Patent: Apr. 3, 2001

(54) METHOD OF MANUFACTURING A SEMICONDUCTOR DEVICE

(75) Inventors: Yoshitaka Yamamoto, Nara; Hideomi Suzawa, Kanagawa; Katunobu Awane; Fumiaki Funada, both of Nara; Shunpei Yamazaki, Tokyo, all of (JP)

(73) Assignees: Semiconductor Energy Laboratory Co., Ltd., Kanagawa-ken; Sharp Kabushiki Kaisha, Osaka, both of (JP)

( * ) Notice: Subject to any disclaimer, the term of this patent is extended or adjusted under 35 U.S.C. 154(b) by 0 days.

(21) Appl. No.: 09/426,947

(22) Filed: Oct. 26, 1999

Related U.S. Application Data

(62) Division of application No. 08/562,156, filed on Nov. 22, 1995, now abandoned.

(30) Foreign Application Priority Data

Nov. 26, 1994 (JP) .................................... 6-315475

(51) Int. Cl.⁷ ............................ H01L 23/48; H01L 29/40
(52) U.S. Cl. ................................. 257/66; 257/65
(58) Field of Search ......................... 257/66, 65

(56) References Cited

U.S. PATENT DOCUMENTS

| 4,002,501 | 1/1977 | Tamura . |
| 4,014,029 | 3/1977 | Lane et al. . |
| 4,174,217 | 11/1979 | Flatley . |

(List continued on next page.)

FOREIGN PATENT DOCUMENTS

| 56-138929 | 10/1981 | (JP) . |
| 63-293881 | 11/1988 | (JP) . |
| 2-185030 | of 1990 | (JP) . |
| 2-164042 | 6/1990 | (JP) . |
| 2-232925 | 9/1990 | (JP) . |
| 5-055581 | of 1993 | (JP) . |
| 5-055582 | of 1993 | (JP) . |
| 5-29298 | 2/1993 | (JP) . |
| 6-267980 | of 1994 | (JP) . |
| 6-69503 | 3/1994 | (JP) . |
| 7-176753 | 7/1995 | (JP) . |

OTHER PUBLICATIONS

Ghandi, "VLSI Fabrication Principles—Silicon and Gallium Arsenide", 2$^{nd}$ Edition, John Wiley & Sons, Inc., A Wiley–Interscience Publication, pp. 620–651, 1986.

Sze, *VLSI Technology,* "Buried Insulators", 2$^{nd}$ Edition, McGraw–Hill Publishing Company, © 1988 & 1983, pp. 366–370.

Yoji Saito et al., "Anisotropic and Damageless Etching of Single–Crystalline Silicon Using Chlorine Trifluorine Molecular Beam", J. Vac. Sci. Technol. B 10 (1), Jan./Feb. 1992, pp. 175–178.

G. Liu et al., "Polycrystalline silicon thin film transistors on Corning 7059 glass substrates using short time, low–temperature proessing", *Appl. Phys. Lett.* 62(20), May 17, 1993, pp. 2554–2556.

G. Liu et al., "Selective area crystallization of amorphous silicon films by low–temperature rapid thermal annealing", *Appl. Phys. Lett.* 55(7), Aug. 14, 1989, pp. 660–662.

Ibbotson et al., "Pleamaless dry etching of silicon with fluorine–containing compounds", J. Appl. Phys. 56(10), Nov. 1984, pp. 2939–2942.

*Primary Examiner*—Stephen D. Meier
(74) *Attorney, Agent, or Firm*—Eric J. Robinson; Nixon Peabody LLP

(57) ABSTRACT

Method of forming an active layer for TFTs without plasma-damaging the side surfaces of the active layer. The method is started with forming a crystalline silicon film on a glass substrate. A resist mask is placed on the silicon film. The silicon film is etched with an etchant gas consisting mainly of a halogen fluoride gas, thus forming the active layer. During this process, the etchant gas is not changed into a plasma to prevent the side surfaces of the active layer from being plasma-damaged. $ClF_3$ can be used as the halogen fluoride gas.

45 Claims, 6 Drawing Sheets

U.S. PATENT DOCUMENTS

| | | |
|---|---|---|
| 4,498,953 | 2/1985 | Cook et al. . |
| 4,546,376 | 10/1985 | Nakata et al. . |
| 4,667,217 * | 5/1987 | Janning . |
| 4,765,865 | 8/1988 | Gealer et al. . |
| 5,135,608 | 8/1992 | Okutani . |
| 5,147,826 | 9/1992 | Liu et al. . |
| 5,162,892 * | 11/1992 | Hayashi et al. . |
| 5,178,721 | 1/1993 | Sugino . |
| 5,275,851 | 1/1994 | Fonash et al. . |
| 5,310,410 | 5/1994 | Begin et al. . |
| 5,320,704 | 6/1994 | Horioka . |
| 5,393,682 | 2/1995 | Liu . |
| 5,403,772 * | 4/1995 | Zhang et al. . |
| 5,470,762 | 11/1995 | Codama et al. . |
| 5,488,001 | 1/1996 | Brotherton . |
| 5,569,936 | 10/1996 | Zhang et al. . |
| 5,595,923 | 1/1997 | Zhang et al. . |
| 5,618,760 | 4/1997 | Soh et al. . |
| 5,621,524 | 4/1997 | Mitani . |
| 5,728,259 | 3/1998 | Suzawa et al. . |
| 5,808,321 * | 9/1998 | Mitanaga et al. . |

* cited by examiner

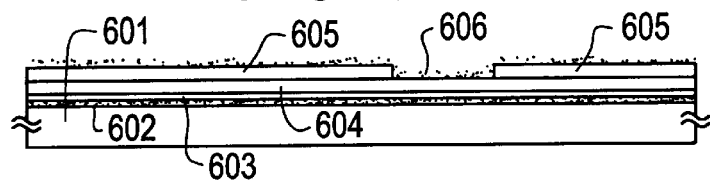
FIG. 6A
FIG. 6B
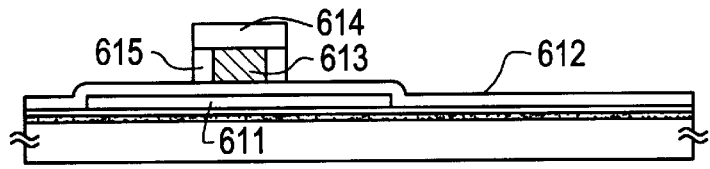
FIG. 6C
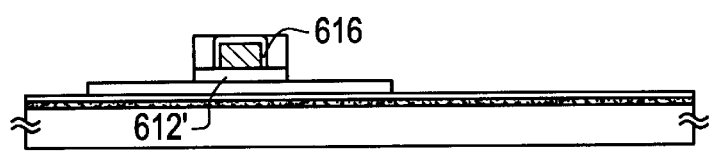
FIG. 6D
FIG. 6E
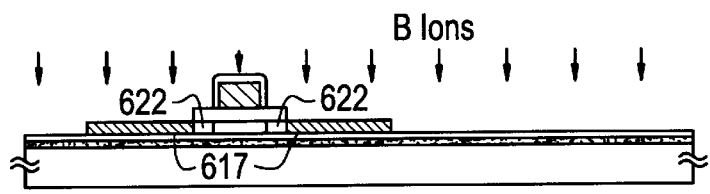
FIG. 6F
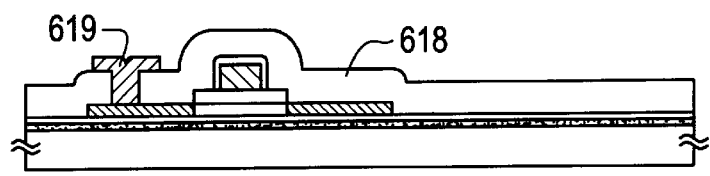
FIG. 6G
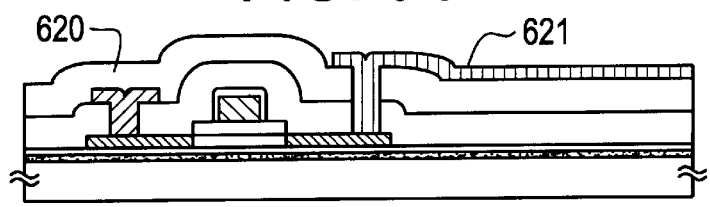

METHOD OF MANUFACTURING A SEMICONDUCTOR DEVICE

This application is a divisional of application Ser. No. 08/562,156, filed Nov. 22, 1995 now abandoned.

FIELD OF THE INVENTION

The present invention relates to a method of forming the active layer of a semiconductor device by patterning and, more particularly, to a method of forming the active layer of a thin film transistor (TFT) by etching.

BACKGROUND OF THE INVENTION

In recent years, active matrix liquid crystal displays have attracted attention. This kind of display device has several hundreds x several hundreds of pixel electrodes arranged in rows and columns. TFTs using a silicon thin film are used for these pixel electrodes. Electric charge to be held at each pixel is controlled by the corresponding TFT.

In principle, the liquid crystal display must transmit light and so the material of the substrate is required to transmit visible light. Examples of the material transmitting light include quartz and glass. Among them, quartz substrates are expensive and undesirable from an economical point of view. Accordingly, glass substrates have enjoyed wide acceptance. In this case, the problem is that how high-performance TFTs are fabricated on glass substrates.

The characteristics of TFTs can be improved most effectively by enhancing the crystallinity of the silicon thin film used. However, where a glass substrate is used, it is difficult to obtain a single-crystal silicon film or a silicon thin film having crystallinity comparable to that of a single-crystal silicon film. Silicon thin films generally produced are poly-crystalline or microcrystalline assuming an imperfect crystal state.

Where a TFT is fabricated, using such a silicon thin film in a polycrystalline or microcrystalline state, the OFF current characteristics pose a great technical problem to be solved. Generally, where a TFT is manufactured, using a silicon thin film in a polycrystalline or microcrystalline state, the OFF current tends to be large. The OFF current is an electrical current flowing between the source and drain when the TFT is in its Off state.

It is now assumed that the source of a TFT arranged at a pixel is connected with a source line and that the drain is connected with a pixel electrode. When the TFT is driven into conduction, i.e., turned ON, a given amount of electric charge flows into the pixel electrode from the source line via the TFT. When the TFT is turned OFF, the charge is retained in the pixel electrode. If the OFF current of the TFT is considerably large, the electric charge gradually leaks from the pixel electrode. Of course, the given charge is not held in the pixel electrode for a given time. As a result, the required display is not provided.

It is considered that the problem of the OFF current is caused by the fact that carriers are moved through grain boundaries of crystals. For example, in the case of an N-channel TFT, when a positive potential is applied to the gate electrode, the channel is made N-type, and the TFT is turned ON. When a negative potential is applied to the gate electrode, the channel is rendered P-type, and the TFT is turned OFF.

When the TFT is turned OFF in this way, the source/drain are the N-type, and the channel becomes the P-type. Therefore, an NPN structure is formed between the source and drain. In principle, no current flows between the source and drain. However, this is an ideal case where the silicon thin film forming the active layer has a single-crystal structure.

In practice, carriers migrate through trap levels existing at grain boundaries. This migration results in an OFF current.

As mentioned previously, a crystalline silicon thin-film semiconductor formed on a glass substrate takes the form of polycrystals or microcrystals. That is, innumerable crystal grains exist in the film. Numerous trap levels exist at these grain boundaries.

The movement of the carriers through the trap levels is especially significant in regions to which a high electric field is applied. This phenomenon is especially noticeable at and near the channel-drain interface. Accordingly, it is known to form a field-relaxation region to suppress movement of the carriers through the trap levels. For this purpose, a lightly doped region or an offset region (also known as an offset gate region) is formed between the channel region and the drain region. These structures are known as the lightly doped drain (LDD) structure and the offset gate structure, respectively.

Where a crystalline silicon thin film is formed on a glass substrate and a TFT is manufactured in practice, using this silicon thin film, the above-described LDD structure or offset structure is useful and capable of suppressing the OFF current to some extent. However, the present situation is that it is difficult to obtain satisfactorily low OFF currents.

Generally, an active layer is formed by the following sequence. Resist is photolithographically patterned into desired form. Using this resist pattern as a mask, a dry etching process is carried out, using a plasma.

After earnestly investigating the aforementioned problem with the OFF characteristics of a TFT, the inventors of the present invention made the following findings.

When the dry etching process is performed to form the above-described active layer, the side surfaces of the active layer are plasma-damaged. As a result, trap levels are formed at a high density at the side surfaces of the active layer.

In a polycrystalline or microcrystalline silicon film in which trap levels exist at a high density, this phenomenon is remarkable. Consequently, trap levels are formed at a high density at the side surfaces of the active layer.

If numerous trap levels are created at the side surfaces of the active layer by the plasma damage, movement of carriers via the trap levels becomes remarkable. That is, the OFF current is increased. This problem is especially significant where the film contains innumerable grain boundaries as in the case of polycrystalline or microcrystalline silicon. This is because trap levels tend to be located and generated at grain boundaries.

The density of the trap levels formed at the side surfaces of the active layer is much higher than the density of the trap levels in the active layer or in the film. Therefore, even if the LDD structure or offset structure is adopted, the number of electric charges moved via the trap levels at the side surfaces of the active layer cannot be suppressed greatly. That is, it is impossible to lower the OFF current value greatly.

The LDD structure and the offset structure relax the electric field intensity in the region in which the electric field tends to be concentrated. This suppresses movement of carriers which are the cause of the Off current. In other words, the number of carriers moved is reduced. However, where the density of trap levels causing movement of carriers is quite high, even if the electric field strength is weakened, it is impossible to reduce the total number of carriers greatly.

The problem arises from trap levels concentrated at the side surfaces of the active layer. Accordingly, if the density of the trap levels at the side surfaces can be reduced, then the problem with the OFF current characteristics can be solved. As described previously, the main cause of the trap levels concentrated at the side surfaces of the active layer is plasma damage during formation of the active layer. Therefore, if this plasma damage can be reduced, then the problem with the OFF current of the TFT can be eased.

One example of the method for avoiding the plasma damage to side surfaces of the active layer may be to use a wet etching process when the active layer is formed. However, this presents various problems including:

(1) Any appropriate etchant capable of selectively etching only a silicon film with high controllability and high reproducibility is not available.

(2) The temperature of the etchant used must be controlled strictly. Furthermore, delicate etching conditions are necessary.

SUMMARY OF THE INVENTION

It is an object of the invention to provide a process for preventing trap levels from being concentrated at side surfaces of an active layer.

A method according to the present invention is intended to form a TFT having an active layer consisting of a silicon thin film in the form of an island. This method is started with placing a mask on the silicon thin film. The silicon thin film is then etched with an etchant gas comprising a halogen fluoride gas to form a region in the form of an island becoming the active layer.

In the above-described method, the TFT having the active layer consisting of a silicon thin film in the form of an island can be constructed as shown in FIGS. 2(A)–2(C), where the active layer 104 is made from a silicon film having crystallinity.

One example of the step of placing a mask on the silicon thin film is illustrated in FIG. 1(B). This step is intended to form the active layer 104 shown in FIG. 2(A).

One example of the above-described step of etching the silicon thin film with an etchant gas containing a halogen fluoride gas is illustrated in FIG. 1(C). In this step, $ClF_3$ is used as the halogen fluoride gas to etch the crystalline silicon thin film 103.

One or more species selected from the group consisting of $ClF_3$, $ClF$, $BrF_3$, $IF_3$, $BrF$, $BrF_5$, and $IF_5$ can be used as the halogen fluoride gas described above. Furthermore, it is not necessary that the halogen fluoride gas be 100% pure. It may be diluted with an appropriate diluting gas.

When an etching step is carried out, using the halogen fluoride gas as shown in FIG. 1(C), it is important that the halogen fluoride gas be not ionized (or, changed into a plasma) to prevent the active layer from being plasma-damaged. For this purpose, the gas is prevented from being excited or ionized. This is accomplished by supplying no electromagnetic energy, i.e., RF energy or microwave energy.

Another aspect of the invention lies in a method of forming an active layer by forming at least a source region, a drain region, and a channel formation region between the source region and the drain region. This method is characterized in that the active layer is formed by etching a silicon film, using a halogen fluoride gas.

In the manufacture of the active layer described above, it is important that the halogen fluoride gas which is an etchant gas be not changed into a plasma to prevent the side surfaces of the active layer from being plasma-damaged. For this purpose, the gas is kept from being ionized or excited. This is achieved by supplying no electromagnetic energy to the halogen fluoride gas. Halogen fluoride gases, especially $ClF_3$, strongly etch silicon. Even if any electro-magnetic energy such as RF energy is not supplied, they can etch silicon at high rates.

The present invention is especially advantageous where the active layer is formed, using the silicon thin film which is crystallized by the action of a metal element for promoting crystallization of silicon. Using a crystalline silicon film as the active layer of a TFT is very effective in enhancing the operation speeds of the TFT. However, where the substrate is made of glass, it is necessary to suppress the heating temperature to the lowest temperature achievable, to prevent the substrate from being deformed or shrunk during this heating process.

This heating temperature can be lowered by making use of a metal element that promotes crystallization of silicon. For example, in order to crystallize an amorphous silicon film formed on a glass substrate by heating, the heating process has been required to be continued for tens of hours or more at a temperature exceeding 600° C. Where a thin film of a metal element for promoting crystallization of silicon is formed on the surface of an amorphous silicon film and then heated, a crystalline silicon film can be obtained by performing a heating step for about 4 hours at 550° C.

In this way, by utilizing a metal element for accelerating crystallization of silicon, a crystalline silicon film can be obtained by performing a heating step in a shorter time and at a lower temperature than heretofore. If this crystalline silicon film created by the action of the metal element is plasma-damaged, trap levels are formed at a high density, for the following reason. Trap levels are easily created around the metal element. The possibility that trap levels are created is increased by collision of ions having high energies.

As the metal element, one or more species selected from the group consisting of Fe, Co, Ni, Ru, Rh, Pd, Os, Ir, Pt, Cu, and Au can be used. Among the metal elements for promoting crystallization of silicon, nickel (Ni) was found most effective.

When the active layer of a TFT is formed by etching techniques, plasma damage to the side surfaces of the active layer can be avoided by employing a dry etching process which uses a halogen fluoride gas and causes no plasma damage. This in turn reduces the OFF current attributed to movement of carriers via the side surfaces of the active layer.

The OFF current due to plasma damage to the side surfaces of the active layer can be most efficiently suppressed by adopting the offset structure or the LDD structure.

The above-described plasma damage to the side surfaces of the active layer becomes serious where a crystalline silicon film (generally in the form of polycrystals or microcrystals) formed on a glass substrate is used. Therefore, where a TFT is manufactured, using the crystalline silicon film formed on the glass substrate, suppression of the plasma damage to the active layer is highly meaningful in that the OFF current is reduced.

Where introduction of a metal element for promoting crystallization of silicon in an amorphous silicon film is used as a method of obtaining a crystalline silicon film, the problem of the plasma damage to the side surfaces of the active layer becomes more significant. Also in this case, therefore, suppression of plasma damage to the side surfaces of the active layer is quite effective in reducing the OFF current of the TFT.

Other objects and features of the invention will appear in the course of the description thereof, which follows.

BRIEF DESCRIPTION OF THE DRAWINGS

FIGS. 6(A)–6(G) are cross-sectional views, showing a manufacturing method for forming a TFT in accordance with Example 3 of the present invention.

DETAILED DESCRIPTION OF THE INVENTION

EXAMPLE 1

Figure 1A:
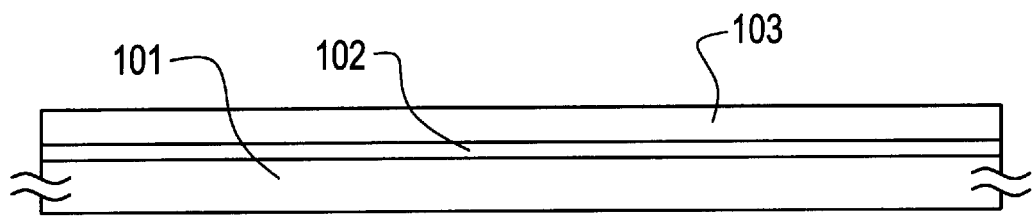
FIGS. 1(A)–1(D) are cross-sectional views, showing a manufacturing method for forming a TFT in accordance with Example 1 of the present invention.

In the present example, the present invention is applied to manufacture of a TFT formed on a glass substrate. The process sequence of the present example is illustrated in FIGS. 1(A)–1(D). First, a silicon oxide film 102 is formed as a buffer film on a glass substrate 101 by plasma-assisted CVD (PCVD) or low-pressure thermal CVD to a thickness of 3000 Å. The substrate 101 is made of Corning 1737 glass or Corning 7059 glass. The silicon oxide film 102 acts to prevent diffusion of impurities from the glass substrate 101 and to reduce the stress between the substrate 101 and an active layer.

After forming the silicon oxide film 102, an amorphous silicon film 103 is formed to a thickness of 500 Å by PCVD or low-pressure thermal CVD. This amorphous silicon film 103 will act as a starting film when the active layer of a TFT is formed (FIG. 1(A)).

After forming the amorphous silicon film 103, it is crystallized by an appropriate means. The method of crystallizing the amorphous silicon film 103 can be heating, laser irradiation, combination thereof, and other known method. In the present example, the crystallization is performed by a heating step making use of a metal element for promoting crystallization of silicon.

The crystallization method used in the present example is described in detail below. In this example, nickel (Ni) is employed as the metal element for promoting crystallization of silicon. First, a nickel acetate solution containing a given concentration of nickel element is applied to the surface of the amorphous silicon film 103 by spin coating. It is necessary that the concentration of the nickel element contained in the nickel acetate solution be adjusted so that the concentration of the nickel element introduced into the amorphous silicon film 103 lies within the range from about $1 \times 10^{16}$ to $5 \times 10^{19}$ cm$^{-3}$, for the following reason. If the amount of nickel element introduced is too large, the nickel becomes nickel silicide, thus deteriorating the semiconductor characteristics. Conversely, if the amount of nickel introduced is too small, then the crystallization is not promoted.

After applying the nickel acetate solution to the surface of the amorphous silicon film 103 and the nickel element is retained in contact with the surface of the amorphous silicon film 103, it is heated to crystallize it. This heating step is performed at 550° C. for 4 hours. Generally, at a temperature of about 550° C., an amorphous silicon film is not crystallized even if it is heated for tens of hours or more. In the present example, since the nickel element is used, the amorphous film can be crystallized by heating at a lower temperature and in a shorter time than conventional. In this connection, where an amorphous silicon film is crystallized by heating in the prior art techniques, the heating process is required to be continued for tens of hours at a temperature higher than 600° C.

Generally, a crystalline silicon film crystallized by heating or laser-irradiating an amorphous silicon film contains a high density of defects and has a high trap level density. The crystalline silicon film formed by the present example of method also has a high trap level density.

Figure 1B:
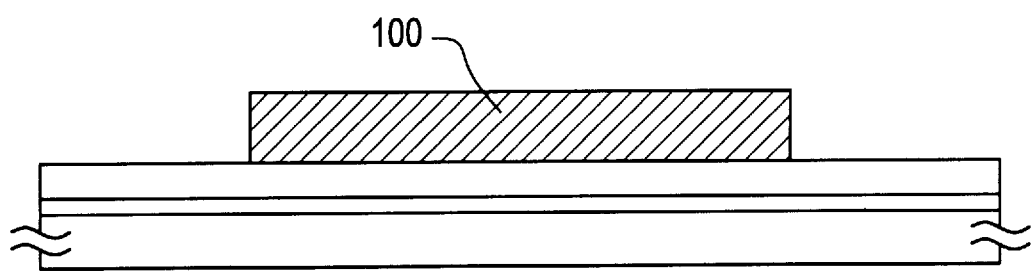
Figure 1C:
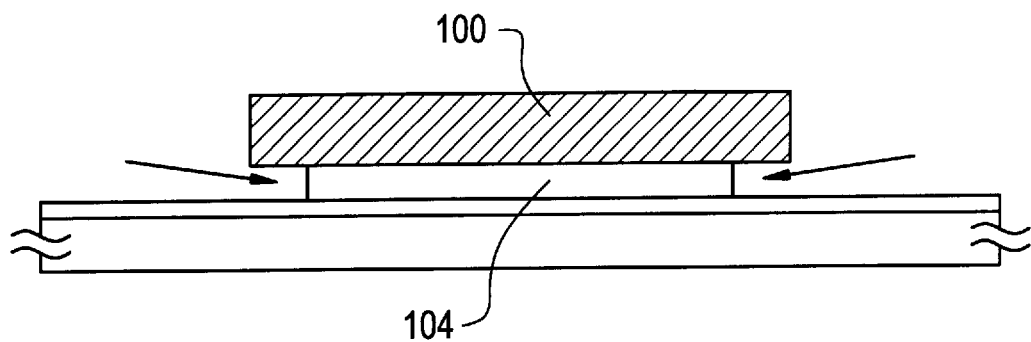

After obtaining the crystalline silicon film, a patterning step is performed according to the present invention to form the active layer of a TFT. First, as shown in FIG. 1(B), a mask 100 for forming the active layer is formed from photoresist. Then, as shown in FIG. 1(C), an etching process is effected, using ClF$_3$ gas, to form the active layer 104 of the TFTs. This etching process can be carried out at room temperature without changing the gas into a plasma. Consequently, plasma damage to the side surfaces of the active layer 104 can be completely prevented.

Another feature is that the resist is hardly damaged or affected. This is an advantage-over the conventional methods, i.e., the RIE method using a plasma or the wet etching method. In these conventional methods, damage to the resist is great, and the resist often cannot be fully removed. The remaining resist presents great problems in semiconductor fabrication processes. It is to be noted that etching using ClF$_3$ gas is isotropic etching.

The etching step for forming the active layer is performed under the following conditions:

etchant gas: ClF$_3$
reaction pressure: 0.4 torr
reaction temperature: room temperature
etching rate: 500 Å/min
mask: photoresist In this example, the etching step is carried out at room temperature. If the heating is done within the temperature range in which the etchant gas is not ionized, the reaction rate can be increased effectively. After completion of the etching, the resist mask 100 is removed, thus obtaining a condition as shown in FIG. 1(D).

Figure 1D:
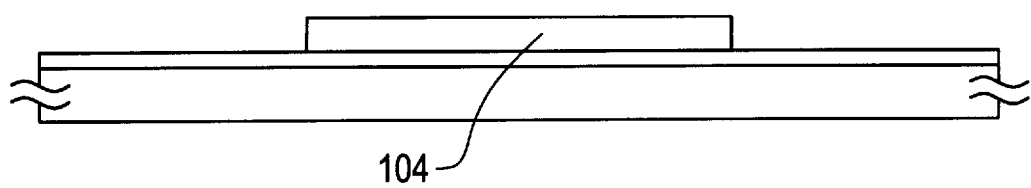
Figure 2A:
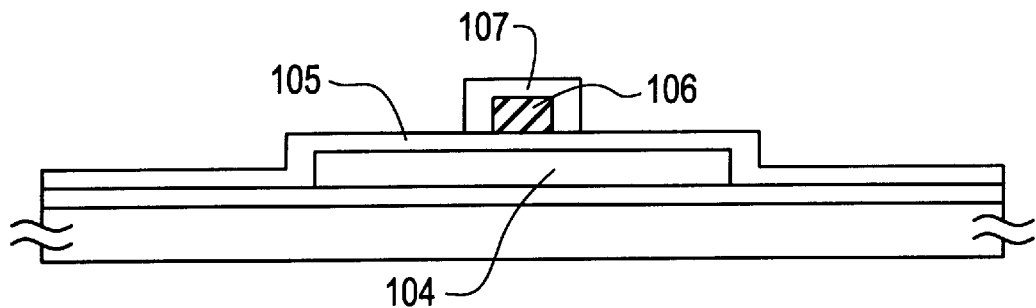
FIGS. 2(A)–2(C) are cross-sectional views, showing a manufacturing method for forming a TFT in accordance with Example 1 of the present invention.

After forming an active layer 104 as shown in FIG. 1(D), a gate-insulating film 105 is formed to a thickness of 1000 Å by PCVD, as shown in FIG. 2(A). Subsequently, a film consisting mainly of aluminum is formed to a thickness of 6000 Å by sputtering techniques. The aluminum film is patterned to form a gate electrode 106. Thereafter, an anodization step is performed, using the gate electrode 106 as an anode within an electrolytic solution. In this manner, an anodic oxide layer 107 is formed to a thickness of 2000 Å (FIG. 2(A)).

Figure 2B:
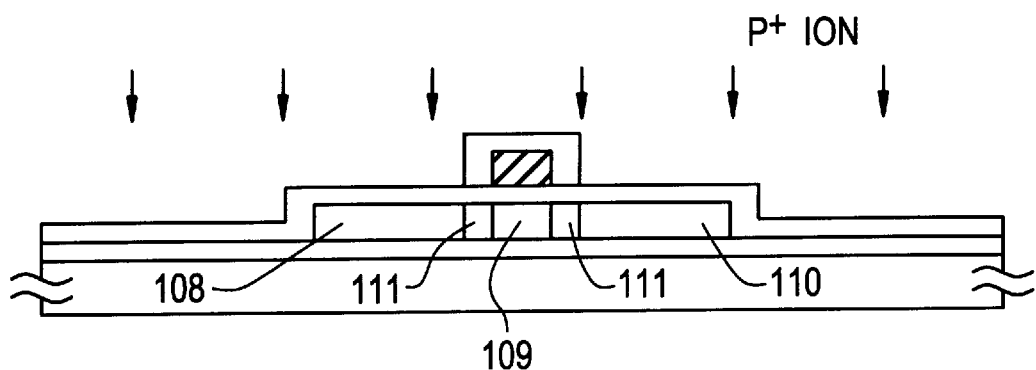

After obtaining the state shown in FIG. 2(A), phosphorus (P) ions are introduced by plasma doping, as shown in FIG. 2(B). Thus, a source region 108 and a drain region 110 are formed in a self-alignment manner. At this time, an offset region 111 is formed while the anodic oxide layer 107 around the gate electrode 106 acts as a mask. No phosphorus ions are implanted into the offset regions 111 and these offset regions 111 are substantially intrinsic in nature. Also, each offset region 111 does not serve as a channel. Rather, the offset region 111 acts as a field relaxation region between the channel and the source/drain regions 108, 110 (FIG. 2(B)).

After completion of the doping, the structure is irradiated with laser light or other intense light to activate the source region 108 and the drain region 110.

Figure 2C:
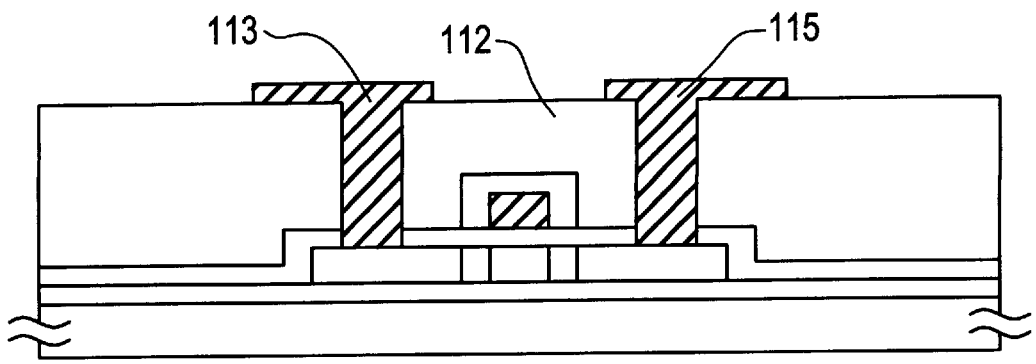

Then, as shown in FIG. 2(C), a silicon oxide film 112 is formed as an interlayer dielectric film to a thickness of 7000 Å by PCVD. Contact holes are formed. A source electrode 113 and a drain electrode 115 are formed from aluminum or other metal. Finally, the structure is heat-treated for 1 hour in a hydrogen ambient at 350° C. In this way, a TFT as shown in FIG. 2(C) is completed.

Figure 3:
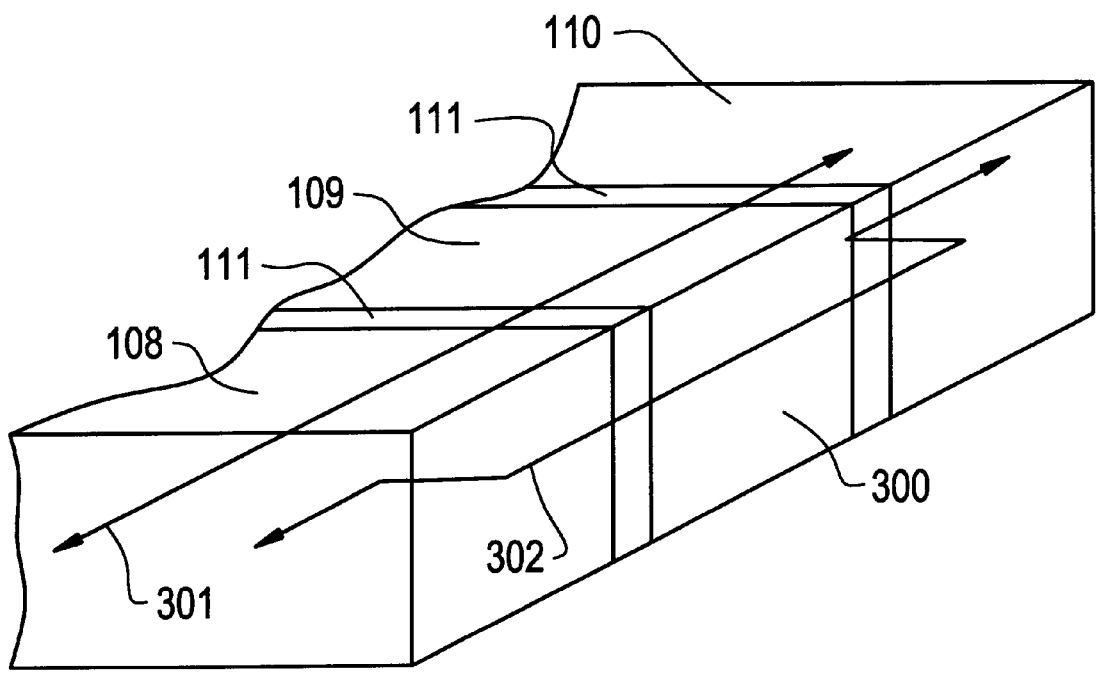
FIG. 3 is a partial enlarged view of the active layer of a TFT of Example 1 of the present invention.

The state of the active layer formed according to the present example is schematically shown in FIG. 3. As described above, the active layer is etched by using $ClF_3$ gas. This prevents plasma damage to the side surface 300 of the active layer. Hence, the trap level density at the side surface 300 of the active layer attributable to plasma damage can be avoided. As a result, the number of carriers passing along a route indicated by 302 can be made fewer.

In the conventional dry etching process (generally, using RIE) making use of a plasma, trap levels are created at a high density at the side surfaces 300 of the active layer by plasma damage, so that the route 302 through which carriers move exists. Conduction of the carriers along the route 302 is made via the trap levels and is independent of whether a channel is formed in the channel formation region 109. Therefore, where the offset region 111 is formed, if a voltage is applied between the source region 108 and the drain region 110, carriers are moved via the route 302. This increases the OFF current.

However, where the structure described in the present example is adopted, the trap level density at the side surfaces 300 of the active layer can be lowered and so the number of carries moving via the route 302 can be suppressed. On the other hand, intrinsic movement of carriers via the channel 301 is by no means affected adversely. Consequently, the best use can be made of the effect of the offset gate region 111. Low OFF current characteristic can be obtained.

EXAMPLE 2

The present example is a process used where an active matrix liquid crystal display is manufactured. In the present example, TFTs (pixel transistors) are formed in an active matrix region. At the same time, TFTs forming a peripheral driver circuit for driving the TFTs arranged in the active matrix region are fabricated.

The process sequence of the present example is illustrated in FIGS. 4(A)–4(D). First, a silicon oxide film 102 is formed as a buffer film on a glass substrate 101 to a thickness of 3000 Å by sputtering techniques.

Then, an amorphous silicon film is formed to a thickness of 500 Å by PCVD or low-pressure thermal CVD. The amorphous film is heated or irradiated with laser light to crystallize it. In this way, a crystalline silicon film 103 is obtained.

Figure 4A:
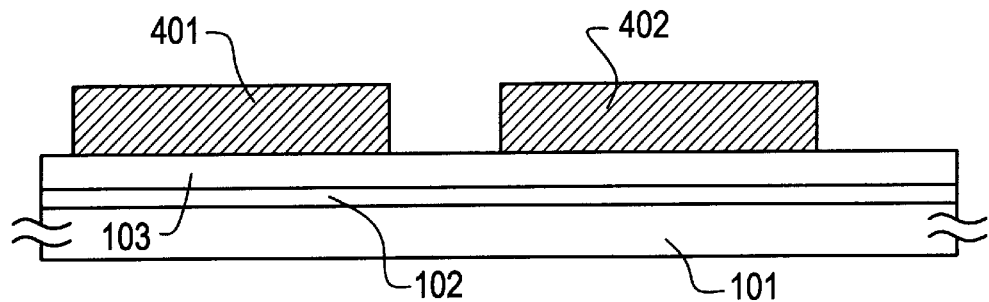
FIGS. 4(A)–4(D) are cross-sectional views, showing a manufacturing method for forming a TFT in accordance with Example 2 of the present invention.
Figure 4B:
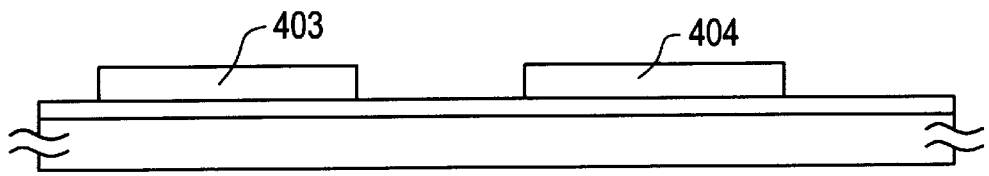

Then, a resist mask 401 for forming the active layer of a TFT forming a peripheral driver circuit and a resist mask 402 for forming the active layer of a TFT arranged in a matrix region, or pixel regions, are formed (FIG. 4(A)).

An etching step is carried out, using $ClF_3$, under the following conditions to form active layers 403 and 404.

etchant gas: $ClF_3$ reaction pressure: 2 torr reaction temperature: room temperature etching rate: 1000 Å/min mask: photoresist After completion of the etching step, the photoresist is removed to obtain the state shown in FIG. 4(B), where the active layer 403 forms a TFT for forming the peripheral driver circuit. The active layer 404 forms a TFT arranged in a pixel region.

After forming, the active layers, a film consisting principally of aluminum is formed to a thickness of 6000 Å by electron-beam evaporation and patterned to form gate electrodes 405 and 406. Then, an anodization step is effected within an electrolytic solution, using the gate electrodes 405 and 406 as anodes. As a result, anodic oxide layers 407 and 408 are formed to a thickness of 2000 Å. The presence of the oxide layers makes it possible to form offset gate regions in an impurity ion introduction step conducted later (FIG. 4(C)).

Figure 4C:
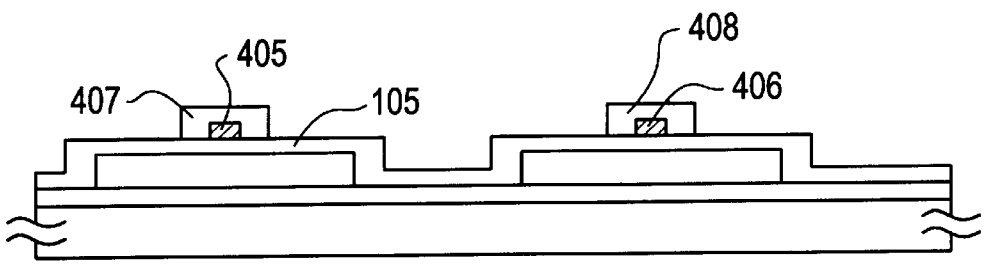
Figure 4D:
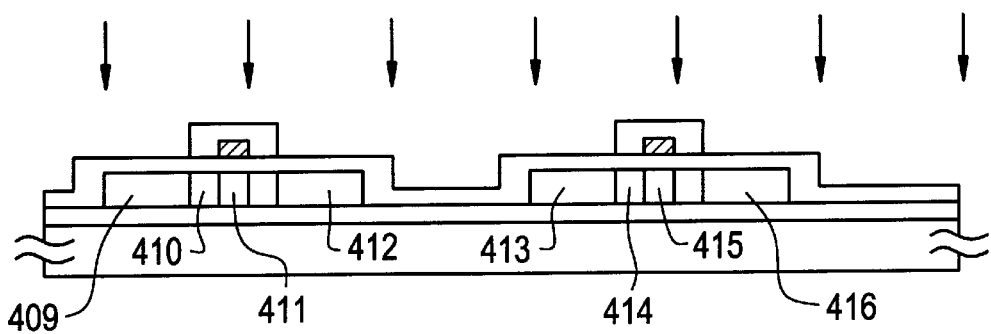

After obtaining the state shown in FIG. 4(C), impurity ions for forming source/drain regions are introduced by ion implantation or plasma doping. In this example, phosphorus ions are introduced by plasma doping to form N-channel TFTs (FIG. 4(D)).

By introducing phosphorus ions, source regions 409, 413, drain regions 412, 416, channel formation regions 411, 415, and offset gate regions 410, 414 are formed in a self-alignment manner. Unimplanted regions are defined as the channel formation regions 411, 415 and the offset gate regions 410, 414 (FIG. 4(D)).

Figure 5A:
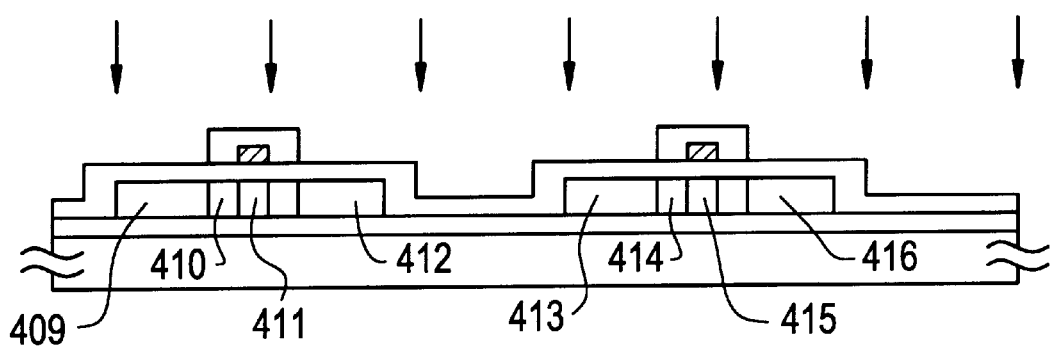
FIGS. 5(A)–5(B) are cross-sectional views, showing a manufacturing method for forming a TFT in accordance with Example 2 of the present invention.

After introducing the impurity ions, the laminate is irradiated with laser light or other intense light to anneal the doped regions. During this annealing step, the source/drain regions amorphized by the previous impurity ion introduction are recrystallized. Also, the introduced impurities are activated (FIG. 5(A)).

Figure 5B:
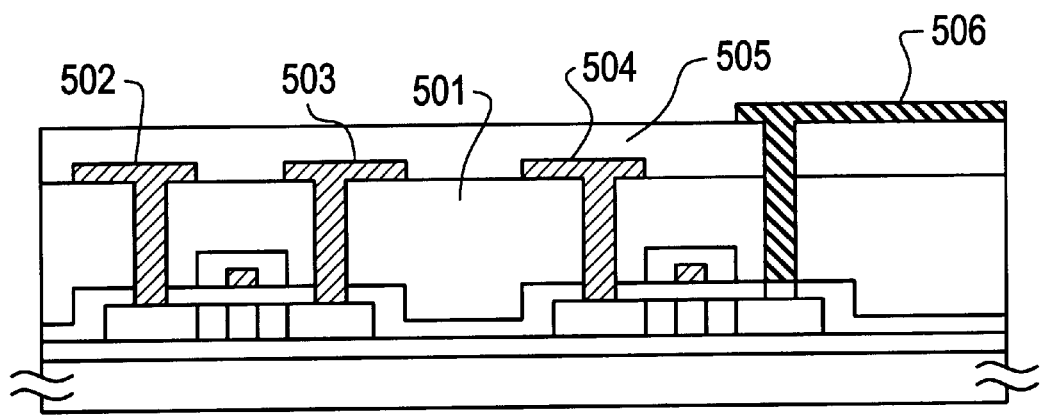

After completion of the formation of the source/drain regions, a silicon oxide film 501 is formed as an interlayer dielectric film to a thickness of 6000 Å by PCVD, as shown in FIG. 5(B). Then, contact holes are formed. A source electrode 502 and a drain electrode 503 for the TFT arranged in the peripheral driver circuit region are formed from aluminum. Simultaneously, a source electrode 504 for the TFT arranged in the pixel region is formed.

Thereafter, a silicon oxide film 505 is formed to a thickness of 3000 Å by PCVD, followed by formation of contact holes. Then, an ITO electrode 506 for forming a pixel electrode is formed. The ITO electrode is directly connected with the drain region 416 of the TFT arranged in the pixel region (FIG. 5(B)).

Finally, a hydrogenation treatment is performed for 1 hour in a hydrogen ambient at 350° C., thus completing the structure shown in FIG. 5(B). Where the structure of the present example is adopted, an OFF current flowing via the side surfaces of the active layers of the TFTs can be reduced greatly. By making use of the offset gate structure, the OFF current can be decreased most effectively. That is, TFTs having small OFF currents can be obtained. These TFTs having small OFF currents are quite suited for TFTs arranged in the pixel region of an active matrix liquid crystal display as shown in FIG. 5(B).

EXAMPLE 3

The present example relates to the structure of a TFT which is disposed in each of pixels arranged in rows and columns of an active matrix liquid crystal display. At least one TFT is arranged in each one pixel region.

The process sequence of the present example for fabricating TFTs is illustrated in FIGS. 6(A)–6(G). First, as shown in FIG. 6(A), a silicon nitride film 602 is formed as a buffer film on a glass substrate 601 by PCVD. Then, a silicon oxide film 603 is formed by sputtering techniques. Thereafter, an amorphous silicon film 604 is formed to a thickness of 500 Å by PCVD or low-pressure thermal CVD. Subsequently, a mask 605 consisting of a film of silicon oxide is formed by conventional photo-lithography techniques. This mask 605 causes a part of the amorphous silicon film 604 to be exposed.

A nickel acetate solution containing a desired concentration of nickel element which is a metal element for promoting crystallization of silicon is applied by spin coating. Under this condition, a layer 606 consisting of nickel or containing nickel is formed (FIG. 6(A)).

The laminate is heat-treated for 4 hours at 550° C., so that crystals are grown as indicated by the arrows 600 parallel to the substrate like needles or pillars. In FIG. 6(B), indicated by 607 is a region in which crystals are grown parallel to the substrate. Indicated by 608 is a region in which nickel element has been directly introduced. The region 608 is heavily doped with nickel element. The growth of the crystals terminates in points 609 and 610. It has been confirmed that these terminal regions 609 and 610 are also heavily doped with nickel element.

It is necessary that the concentration of nickel element in the nickel acetate solution spin-coated at the step of FIG. 6(A) be adjusted so that the maximum measured concentration of nickel in the region 607 lies within the range from $1\times10^{16}$ to $5\times10^{19}$ $cm^{-3}$. The maximum concentration of nickel is measured by SIMS (secondary ion mass spectrometry).

Then, an active layer 611 is formed by etching techniques, by making use of the present invention, as shown in FIG. 6(C). More specifically, a resist mask is formed on top of a region becoming the active layer 611 by photolithography. Then, this region is etched with $ClF_3$ gas, thus forming the active layer 611. The conditions may be exactly the same as those used in Example 1 or 2.

Subsequently, a silicon oxide film 612 is formed as a gate-insulating film to a thickness of 1000 Å by PCVD. An aluminum film containing scandium is formed to a thickness of 6000 Å by sputtering techniques. Then, the aluminum film is etched, using a mask 614 consisting of photoresist. After this etching step, the resist mask 614 is left behind. Hence, a part of the aluminum film remains. Using the remaining aluminum film portion as an anode, an anodization step is carried out within an electrolytic solution. Thus, a porous anodic oxide layer 615 is formed to a thickness of about 5000 Å. During this anodization, 3–20% nitric acid (30° C.) is used as the electrolytic solution. A voltage of 10 V is applied to the remaining aluminum film. After this manufacturing step, the remaining aluminum layer 613 becomes a gate electrode (FIG. 6(C)).

Then, the resist mask 614 is removed. A second anodization step is carried out, using the gate electrode 613 as an anode, within an ethylene glycol solution having a pH of about 7 and containing 1–3% tartaric acid. In this way, a dense barrier type anodic oxide layer 616 is formed to a thickness of 2000 Å.

Thereafter, the exposed gate-insulating film 612 is etched by dry etching, utilizing the RIE method. Because of different etching rates, the anodic oxides 615 and 616 are hardly etched during this step. This step is stopped when the active layer 611 is exposed. In this manner, a remaining gate-insulating film 612' is obtained, as shown in FIG. 6(D).

After obtaining the state shown in FIG. 6(D), the porous anodic oxide layer 615 is removed using the barrier type anodic oxide film 616 as a mask. After obtaining the state shown in FIG. 6(E), boron (B) ions are introduced into the active layer 611 by plasma doping. This introduction is performed at a low accelerating voltage of about 10 kV. Accordingly, entry of the boron ions is suppressed under the exposed portions of the gate-insulating film 612' so that the boron ions are not introduced into regions indicated by 622. On the other hand, the boron ions are implanted into regions 617. In this way, the regions 622 are formed as offset regions.

Then, a heat treatment at 500° C. for 4 hours is performed to activate the dopant ions. To enhance the effect of the annealing, the laminate is irradiated with KrF excimer laser light. At this time, the interface (PI junction) between the regions 617 and 622 is sufficiently activated by laser light transmitted through the gate-insulating film (silicon oxide film 612'). If trap levels exist at the interface between the region 617 (becoming source/drain regions) and the region 622 (becoming offset regions), an OFF current is induced. Therefore, activation or annealing of this interface is very effective in reducing the OFF current.

Thereafter, a silicon oxide film 618 is formed as an interlayer dielectric film to a thickness of 3000 Å by PCVD, followed by formation of contact holes. Then, a source electrode 619 is formed from an aluminum film. Subsequently, a silicon nitride film 620 is formed as an interlayer dielectric film to a thickness of 3000 Å. Contact holes are then formed. An ITO electrode 621 becoming a pixel electrode is formed. In this way, a P-channel TFT having the offset regions 622 can be obtained.

Where a crystalline silicon film is formed by making use of a metal element for promoting crystallization of silicon and an active layer is formed by patterning the crystalline silicon film, if the surface of the active layer is plasma-damaged, then trap levels would be created due to the metal element. As mentioned previously, when the active layer is formed, its side surfaces are especially greatly plasma-damaged.

Where an etching process causing no plasma damage is conducted to form an active layer as in the present example, even if a metal element for promoting crystallization of silicon is utilized during manufacture of the crystalline silicon film forming the active layer, the trap level density at the side surfaces of the active layer is not very high. Consequently, movement of carriers via the side surfaces of the active layer can be suppressed well. Hence, TFTs having low OFF current can be obtained. Since movement of carriers via the side surfaces of the active layer can be reduced, the effects of the use of the offset region or light doped regions can be maximized.

In the present invention, when the active layer of TFTs is formed, generation of trap levels at the side surfaces of the active layer can be prevented by using an etching method which causes no plasma damage. This can suppress movement of carriers via the trap levels existing at the side surfaces of the active layer. In consequence, the value of the OFF current can be reduced.

What is claimed is:

1. An active matrix type display device having at least a pixel region over a substrate, said pixel region comprising:
    at least an insulating film comprising silicon nitride and formed on said substrate;
    a semiconductor film comprising silicon and formed over said insulating film, said semiconductor film having at least a channel region, a source region, and a drain region;
    a gate electrode formed adjacent to said semiconductor film with a gate insulating film interposed therebetween;
    a plurality of interlayer films formed over said semiconductor film said gate electrode, one of said interlayer films comprising silicon nitride;
    an electrode connected to one of said source and drain regions, said electrode formed under said one of said interlayer films comprising silicon nitride; and
    a pixel electrode formed over said interlayer film comprising silicon nitride.

2. A device according to claim 1, wherein said substrate is a glass substrate.

3. A device according to claim 1, wherein said semiconductor film further has a pair of offset regions adjacent to said channel region.

4. A device according to claim 1, wherein said semiconductor film further has light doped regions located adjacent to said source region and said drain region, respectively.

5. A device according to claim 1, wherein said semiconductor film includes a metal element selected from the group consisting of Ni, Fe, Co, Ru, Rh, Pd, Os, Ir, Pt, Cu, and Au.

6. A device according to claim 5, wherein said semiconductor film includes said metal element at concentration of $1 \times 10^{16} - 5 \times 10^{19}$ cm$^{-3}$.

7. A device according to claim 1, wherein said gate insulating film comprises silicon oxide.

8. A device according to claim 1, wherein said gate electrode is formed on said channel region with said gate insulating film interposed therebetween.

9. A device according to claim 1, wherein said active matrix type display device is a liquid crystal display device.

10. An active matrix type display device having at least a pixel region over a substrate, comprising:
    a plurality of insulating films formed on said substrate, one of said insulating films comprising silicon nitride;
    a semiconductor film comprising silicon and formed over said silicon nitride film, said semiconductor film having at least a channel region, a source region, and a drain region;
    a gate electrode adjacent to said semiconductor film with a gate insulating film interposed therebetween;
    an electrode connected to one of said source and drain regions;
    at least an interlayer film comprising silicon nitride and formed over said semiconductor film, said gate electrode, and said electrode; and
    a pixel electrode over said interlayer insulating film comprising silicon nitride.

11. A device according to claim 10, wherein said substrate is a glass substrate.

12. A device according to claim 10, wherein said semiconductor film further has a pair of offset regions adjacent to said channel region.

13. A device according to claim 10, wherein said semiconductor film further has light doped regions located adjacent to said source region and said drain region, respectively.

14. A device according to claim 10, wherein said semiconductor film includes a metal element selected from the group consisting of Ni, Fe, Co, Ru, Rh, Pd, Os, Ir, Pt, Cu, and Au.

15. A device according to claim 14, wherein said semiconductor film includes said metal element at concentration of $1 \times 10^{16} - 5 \times 10^{19}$ cm$^{-3}$.

16. A device according to claim 10, wherein said gate insulating film comprises silicon oxide.

17. A device according to claim 10, wherein said gate electrode is formed on said channel region with said gate insulating film interposed therebetween.

18. A device according to claim 10, wherein said active matrix type display device is a liquid crystal display device.

19. An active matrix type display device having at least a pixel region formed over a substrate, said pixel region comprising:
    a plurality of insulating films formed on said substrate, one of said insulating films comprising silicon nitride;
    a semiconductor film comprising silicon and formed over said silicon nitride film, said semiconductor film having at least a channel region, a source region, and a drain region;
    a gate electrode formed adjacent to said semiconductor film with a gate insulating film interposed therebetween;
    a plurality of interlayer films formed over said semiconductor film and said gate electrode, one of said interlayer films comprising silicon nitride;
    a source electrode formed under said one of interlayer films comprising silicon nitride; and
    a pixel electrode connected to said semiconductor film formed over said interlayer film comprising silicon nitride.

20. A device according to claim 19, wherein said substrate is a glass substrate.

21. A device according to claim 19, wherein said semiconductor film further has a pair of offset regions adjacent to said channel region.

22. A device according to claim 19, wherein said semiconductor film further has light doped regions located adjacent to said source region and said drain region, respectively.

23. A device according to claim 19, wherein said semiconductor film includes a metal element selected from the group consisting of Ni, Fe, Co, Ru, Rh, Pd, Os, Ir, Pt, Cu, and Au.

24. A device according to claim 23, wherein said semiconductor film includes said metal element at concentration of $1 \times 10^{16} - 5 \times 10^{19}$ cm$^{-3}$.

25. A device according to claim 19, wherein said gate insulating film comprises silicon oxide.

26. A device according to claim 19, wherein said gate electrode is formed on said channel region with said gate insulating film interposed therebetween.

27. A device according to claim 19, wherein said active matrix type display device is a liquid crystal display device.

28. An active matrix type display device having at least a pixel region formed over a substrate, comprising:
    a plurality of insulating films formed on said substrate, said insulating films having a silicon nitride and a silicon oxide film;
    a semiconductor film comprising silicon and formed over said silicon nitride film, said semiconductor film having at least a channel region, a source region, and a drain region;
    a gate electrode formed adjacent to said semiconductor film with a gate insulating film interposed therebetween;

a plurality of interlayer films formed over said gate electrode, said interlayer films having a silicon nitride film and a silicon oxide film;

an electrode connected to one of said source and drain regions and formed under said interlayer film comprising silicon nitride; and a pixel electrode formed over said interlayer film comprising silicon nitride.

29. A device according to claim 28, wherein said substrate is a glass substrate.

30. A device according to claim 28, wherein said semiconductor film further has a pair of offset regions adjacent to said channel region.

31. A device according to claim 28, wherein said semiconductor film further has light doped regions located adjacent to said source region and said drain region, respectively.

32. A device according to claim 28, wherein said semiconductor film includes a metal element selected from the group consisting of Ni, Fe, Co, Ru, Rh, Pd, Os, Ir, Pt, Cu, and Au.

33. A device according to claim 32, wherein said semiconductor film includes said metal element at concentration of $1\times10^{16}$–$5\times10^{19}$ cm$^{-3}$.

34. A device according to claim 28, wherein said gate insulating film comprises silicon oxide.

35. A device according to claim 28, wherein said electrode connected to said semiconductor film through a contact hole formed in said interlayer film comprising silicon oxide.

36. A device according to claim 28, wherein said active matrix type display device is a liquid crystal display device.

37. An active matrix type display device having at least a pixel region formed over a substrate, said pixel region comprising:

a first insulating film comprising silicon nitride and formed on said substrate;

a second insulating film comprising silicon oxide and formed on said first insulating film;

a semiconductor film comprising silicon formed on said second insulating film, said semiconductor film having at least a channel region, a source region, and a drain region;

a gate insulating film on said semiconductor film;

a gate electrode on said gate insulating film;

a first interlayer film comprising silicon oxide formed over said gate electrode;

a source electrode formed over said first interlayer film, said source electrode connected to said semiconductor film through a contact hole formed in said first interlayer film;

a second interlayer film comprising silicon nitride formed over said first interlayer film; and a pixel electrode formed over said second interlayer film and electrically connected to said semiconductor film.

38. A device according to claim 37, wherein said substrate is a glass substrate.

39. A device according to claim 37, wherein said semiconductor film further has a pair of offset regions adjacent to said channel region.

40. A device according to claim 37, wherein said semiconductor film further has light doped regions located adjacent to said source region and said drain region, respectively.

41. A device according to claim 37, wherein said semiconductor film includes a metal element selected from the group consisting of Ni, Fe, Co, Ru, Rh, Pd, Os, Ir, Pt, Cu, and Au.

42. A device according to claim 41, wherein said semiconductor film includes said metal element at concentration of $1\times10^{16}$–$5\times10^{19}$ cm$^{-3}$.

43. A device according to claim 37, wherein said gate insulating film comprises silicon oxide.

44. A device according to claim 37, wherein said pixel electrode comprises ITO.

45. A device according to claim 37, wherein said active matrix type display device is a liquid crystal display device.

* * * * *